United States Patent
Eglit

(10) Patent No.: US 6,320,574 B1
(45) Date of Patent: *Nov. 20, 2001

(54) CIRCUIT AND METHOD FOR GENERATING PIXEL DATA ELEMENTS FROM ANALOG IMAGE DATA AND ASSOCIATED SYNCHRONIZATION SIGNALS

(75) Inventor: Alexander J. Eglit, Half Moon Bay, CA (US)

(73) Assignee: Genesis Microchip, Corp., Alviso, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/082,070

(22) Filed: May 20, 1998

Related U.S. Application Data

(63) Continuation of application No. 08/803,824, filed on Feb. 24, 1997, now Pat. No. 5,796,392.

(51) Int. Cl.[7] ................................................... G09G 5/12

(52) U.S. Cl. ...................... 345/213; 345/213; 345/501; 348/537; 348/512

(58) Field of Search .................................... 345/501, 519, 345/520, 132, 99, 213, 3, 211, 11, 204; 348/510, 512, 513, 536, 537, 544, 803

(56) References Cited

U.S. PATENT DOCUMENTS

| | | | |
|---|---|---|---|
| 4,018,990 | 4/1977 | Long et al. | 358/149 |
| 4,346,407 | 8/1982 | Baer et al. | 358/149 |
| 4,488,170 | 12/1984 | Nillesan | 358/26 |
| 4,527,145 | 7/1985 | Haussmann et al. | 358/19 |
| 4,554,582 | 11/1985 | Wine | 358/149 |
| 4,590,602 | 5/1986 | Wolaver | 375/120 |
| 4,616,259 | 10/1986 | Moran et al. | 358/148 |
| 4,686,560 | 8/1987 | Balaban et al. | 358/19 |
| 4,694,327 | 9/1987 | Demmer et al. | 358/13 |
| 4,700,217 | 10/1987 | Balaban et al. | 358/23 |
| 4,703,340 | 10/1987 | Balaban et al. | 358/19 |
| 4,802,009 | 1/1989 | Hartmeier | 358/158 |
| 4,893,319 | 1/1990 | Ziuchkovski | 375/111 |
| 5,005,079 | 4/1991 | Satomi | 358/158 |
| 5,010,403 | 4/1991 | Wardzala | 358/139 |
| 5,086,295 | 2/1992 | Boettcher et al. | 358/158 |
| 5,101,197 | 3/1992 | Hix et al. | 345/87 |
| 5,184,091 | 2/1993 | Srivastava | 331/10 |
| 5,185,603 | 2/1993 | Medlin | 340/814 |
| 5,202,669 | 4/1993 | Ishimochi et al. | 340/721 |
| 5,280,345 | 1/1994 | Uehara et al. | 358/37 |
| 5,335,018 | 8/1994 | Möhlmann et al. | 348/536 |

(List continued on next page.)

FOREIGN PATENT DOCUMENTS

| | | | |
|---|---|---|---|
| 0 299 724 A2 | 7/1988 | (EP) . | |
| 0 405 523 A2 | 6/1990 | (EP) . | |
| 0 609 843 A1 | 2/1994 | (EP) . | |
| 615222-A1 | 3/1993 | (EP) | G09G/5/12 |
| 56-137736 | 10/1981 | (JP) . | |
| 63-14522 | 7/1986 | (JP) . | |
| 5-22277 | 1/1993 | (JP) . | |
| 7-334141 | 12/1995 | (JP) . | |
| 8-172353 | 6/1996 | (JP) . | |
| 8-340254 | 12/1996 | (JP) . | |
| WO 89/05065 | 6/1989 | (WO) . | |

*Primary Examiner*—Lun-Yi Lao
(74) *Attorney, Agent, or Firm*—Law Firm of Naren Thappeta

(57) ABSTRACT

A clock recovery circuit in a digital display unit for recovering a time reference signal associated with analog display data. The clock recovery circuit includes a phase-locked loop (PLL) implemented in digital domain and an analog filter to eliminate any undesirable frequencies from the output signal of the PLL. The PLL includes independent control loops to track long term frequency drifts of the time reference signal and the transient phase differences respectively. By providing such independent control loops, the generated clock can be better synchronized with the time reference signal.

11 Claims, 5 Drawing Sheets

U.S. PATENT DOCUMENTS

| | | | |
|---|---|---|---|
| 5,359,366 | 10/1994 | Ubukata et al. | 348/536 |
| 5,459,766 | 10/1995 | Huizer et al. | 375/376 |
| 5,497,202 | 3/1996 | Kim | 348/536 |
| 5,515,108 | 5/1996 | Kim | 348/498 |
| 5,528,307 * | 6/1996 | Owada et al. | 348/542 |
| 5,539,473 | 7/1996 | Kommurusch et al. | 348/537 |
| 5,574,406 | 11/1996 | Sauer et al. | 348/735 |
| 5,623,311 | 4/1997 | Phillips et al. | 348/396 |

* cited by examiner

CIRCUIT AND METHOD FOR GENERATING PIXEL DATA ELEMENTS FROM ANALOG IMAGE DATA AND ASSOCIATED SYNCHRONIZATION SIGNALS

RELATED APPLICATIONS

The present application is related to co-pending U.S. Patent Application entitled, "A Method and Apparatus for Upscaling an Image", Filed Concurrently with the present application, Serial Number UNASSIGNED, Attorney Docket Number: PRDN-0001, and is incorporated in its entirety herewith.

The present application is also related to and is a continuation of application Ser. No. 08/803,824 filed Feb. 24, 1997, now U.S. Pat. No. 5,796,392, entitled, "Method and Apparatus for Clock Recovery in a Digital Display Unit."

BACKGROUND OF THE INVENTION

1. Field of the Invention

The present invention relates to graphics system, and more specifically to a method and apparatus for recovering a clock signal associated with an analog display data received in a digital display unit (e.g., flat-panel monitor) of a graphics system.

2. Related Art

Digital display units are often used to display images. A flat-panel monitor generally used in lap-top computers is an example of such a digital display unit. A flat-panel monitor typically receives a source image from a graphics controller circuit and displays the source image. Flat-monitors which are being increasingly deployed with desk-top computers is another example of such a digital display unit. The source image is usually received in the form of analog data such as RGB signals well-known in the art.

Digital display devices often need to convert the received analog data into a sequence of pixel data. The need for such a conversion can be appreciated by understanding the general layout of a typical digital display device, which is explained below.

Digital display devices generally include a display screen including a number of horizontal lines. FIG. 1A is a block diagram illustrating an example display screen 100. Each horizontal line (shown as 101 through 106), in turn, is divided into several discrete points, commonly referred to as pixels. Pixels in the same relative position within a horizontal line may be viewed as forming a vertical lien (shown as dotted line 108).

The number of horizontal and vertical lines defines the resolution of the corresponding digital display device. Resolutions of typical screens available in the market place include 640×480, 1024×768 etc. At least for the desk-top and lap-top applications, there is a demand for increasingly bigger size display screens. Accordingly, the number of horizontal display lines and the number of pixels within each horizontal line has also been generally increasing.

Thus, to display a source image, the source image is divided into a number of points and each point is displayed on a pixel. Each point may be represented as a pixel data element. Display signals for each pixel in display 100 may be generated using the corresponding display data element. However, as noted earlier, the source image may be received in the form of an analog signal. Thus, the analog data needs to be converted into pixel data for display on a digital display screen.

It is helpful to understand the typical format of the analog data to appreciate the usual conversion process. Generally, each source image is transmitted as a sequence of frames, with each frame including a number of horizontal scan lines. Image is generated on display screen 100 by displaying these successive frames.

Usually, a time reference signal is provided in parallel to divide the analog signal into horizontal scan lines and frames. In the VGA/SVGA environments known in the art, the reference signals include VSYNC and HSYNC. The VSYNC signal indicates the beginning of a frame and the HSYNC signal indicates the beginning of a next source scan line. The relationship between HSYNC and the analog signal data is illustrated further with reference to FIG. 1B.

Signal 150 of FIG. 1B represents an analog display data signal in time domain. Analog signal 150 represents a display image to be generated on display screen 100. The display signal portions 103B, 104B, 105B etc. represent display data on corresponding horizontal lines 103A, 104B, and 105B respectively. The portions shown as straight lines correspond to a 'retrace' period, which signifies the transition to a next horizontal line.

Such transitions are typically indicated by another signal (e.g., HSYNC signal in computer displays). Pulses 103B, 104B, and 105B represent such transitions. Thus, after a transition, the display portion of the signal may be sampled a number of times. The exact number may be proportional to the number of pixels on each horizontal line on display screen 100. Each display portion is generally sampled the same number of times to generate samples for each pixel.

Thus, to convert the source image received in analog signal form to pixel data suitable for display on a digital display device, each horizontal scan line is converted to a number of pixel data. For such a conversion, each horizontal scan line of analog data is sampled a predetermined number of times. The sampled value is represented as a number, which constitutes a pixel data element.

Each horizontal scan line is typically sampled using a sampling clock signal. That is, the horizontal scan line is usually sampled during each cycle of the sampling clock. Accordingly, the sampling clock is designed to have a frequency such that the display portion of each horizontal scan line is sampled a desired number of times. The desired number can correspond to the number of pixels on each horizontal display line of the display screen. However, the desired number can be different that the number of pixels on each horizontal display line.

Using the sampling scheme described above, each horizontal scan line of a source frame is represented as a number of pixel data. It will be readily appreciated that the relative position of source image points needs to be properly maintained when displaying the source image. Otherwise, some of the lines will appear skewed in relation to the other on the display screen.

To maintain a proper relative position of the source image pixels, the sampling clock may need to be synchronized with the reference signal. That is, assuming for purposes of explanation that HSYNC signal is used as a time reference, the beginning of sampling of analog data for a horizontal display line may need to be synchronized with HSYNC signal pulse. Once such a synchronization is achieved, the following pixels in the same horizontal lines may also be properly aligned with corresponding pixels in other lines.

Phase-locked loop (PLL) circuits implemented using analog components have conventionally been used to achieve such a synchronization. FIG. 2 is a block diagram of an example PLL circuit 200 which is implemented for such a synchronization. In addition, PLL circuit 200 generates the sampling clock signal also. PLL circuit 200 includes phase detector 210, filter 220, amplifier 230, voltage controlled oscillator (VCO) 240, and frequency divider 250. Phase detector 210 compares a time reference (e.g., VSYNC) received on line 102 and sampling clock (more accurately, a signal having a predetermined fraction of the sampling signal) received on line 251. The two signals are referred to as f1 and f2 for brevity.

Phase detector 210 provides on line 212 a signal having a difference of the frequencies of f1 and f2. The signal on line 212 may also include several harmonics of the difference frequency. Filter 220 is generally designed as a low pass filter to eliminate undesirable components. When the frequencies f1 and f2 are close, but not equal, line 223 will carry a signal with the difference frequency. VCO 240 is designed to generate a signal with a predetermined frequency. However, the frequency is altered depending on the voltage level received on line 234.

Amplifier 230 amplifies the signal on line 223 to provide a desired level of voltage on line 234 to modify the frequency of VCO 240. The voltage level is generated so as to achieve a synchronization of the frequencies f1 and f2. Frequency divider 250 divides the frequency of clock signal received on line 245 by a factor of n. By choosing an appropriate value of n, analog signal data for each horizontal source scan line can be sampled a desired number of times. The signal on line 245 can be used for such a sampling.

However, it is well known in the art, the reference frequency (HSYNC) can vary by a slight value from an average frequency during normal operating conditions. In addition, the reference frequency can drift over a prolonged period of time due to, for example, temperature changes in the circuits generating the analog source image data. Further, jitter may be present in both the reference signal and the clock signal generated by the analog PLL.

In general, it is desirable that the PLL of FIG. 2 track the long term drifts while eliminating the jitters. This may be achieved by having a PLL circuit with low bandwidth (e.g., 100 to 1000 Hz). However, such a low bandwidth generally requires a capacitor having a large size, which may be hard to integrate into a relatively small-sized integrated circuits.

Some prior approaches have placed the capacitor external to the integrated circuit, with the capacitor being coupled to the integrated circuit by pads. One problem with this approach is that noise is introduced into the analog PLL loop due to the external couplings. Analog PLLs are generally sensitive to such noises, leading to instability in the PLL loop. Without a low bandwidth in the loop, PLL 200 may be unable to track deviations in the reference signal closely, which may be unacceptable in some situations as explained below.

Deviations of about 5 to 20 nano-seconds in time reference period can be common in a typical graphics environment. These deviations are usually more problematic for larger size display screens. To illustrate this point with an example, a 640×480 size display screen has a pixel processing period (i.e., average time to display each pixel) of 40 nano-seconds, while a large 1280×1080 size monitor can have a pixel processing period of about 8–9 nano-seconds. A deviation of 20 nano-seconds may not have a perceptible impact on the display of a 640×480 screen due to the relatively larger pixel processing period, whereas the same amount of deviation can cause the display on the large monitor to be skewed by two pixels.

Such a skew between lines is generally perceptible for the human eye and the resulting display quality may be unacceptable. The display quality is further exacerbated if the number of such skews is larger. As is well known in the art, the display quality problems can be ameliorated by a circuit which can track the time reference signal more closely. Therefore, what is needed is a circuit which tracks the time reference signal closely.

SUMMARY OF THE INVENTION

The present invention is directed to a clock recovery circuit implemented in a digital display unit. The digital display unit receives an analog signal data and an associated time reference signal. Together, they represent an image to be displayed on a digital display screen usually provided in the digital display unit.

The clock recovery circuit provides a sampling clock based on the time reference signal. The sampling clock is used to sample the analog signal data, and the resulting pixel data is used to generate display signals on the display screen.

The clock recovery circuit includes a digital phase-locked loop (PLL). The bandwidth of the PLL can be instantaneously changed because of the digital implementation. In addition, the long term frequency and the temporary phase fluctuations are tracked using different control loops. As a result, considerable flexibility is available to a designer to track the time reference signal.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

1. Overview and Discussion of the Invention

Figure 3:
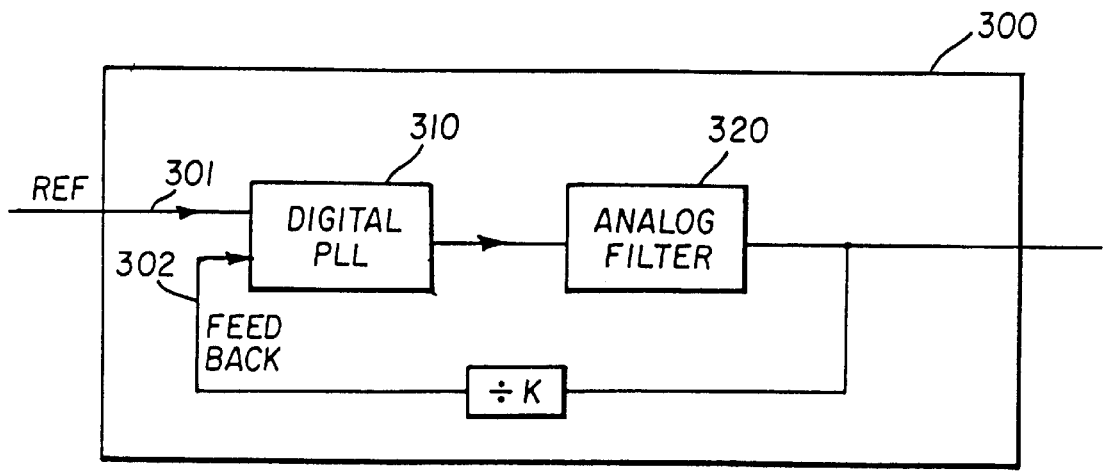
FIG. 3 is a block diagram illustrating an embodiment of the clock recovery circuit of the present invention.

The present invention is described in the context of clock recovery circuit 300 (FIG. 3) which includes digital PLL circuit 310 and analog filter 320. The output of PLL circuit 310 is coupled to the input of analog filter 320. PLL circuit 310 is implemented using digital components and signals.

In operation, PLL circuit 310 receives as input a time reference 301 and generates output signal 312. While generating the output signal, PLL signal 310 attempts to synchronize the output signal 312 with time reference. Analog filter 320 filters any undesirable spectral components in the output signal 312 and provides the filtered signal as input to PLL circuit on input 302.

PLL circuit 310 is implemented using digital components and a designer is provided considerable flexibility to specify the degree or manner in which output signal 312 should track reference signal 301. Due to such a flexibility, the bandwidth of PLL circuit 310 can be dynamically varied such that PLL circuit 310 can be made to adequately track reference signal 301. Such a close tracking may prevent relative skewing among the display lines.

As PLL circuit 310 is implemented using digital components, the circuit can be implemented to have a narrow bandwidth loop. Conventional analog PLLs may require large capacitors to implement an equivalent circuit. As already explained in the background section, integration of large capacitors into a semiconductor integrated circuit may be problematic.

Analog filter 320 can be conventional and is implemented using analog components in a known way. The output signal of analog signal corresponds to the clock (e.g., sampling clock) synchronized with the time reference REF. The output signal is divided by K, where K may correspond to the number of samples taken per each horizontal source image line.

Before describing the invention in great detail, it is useful to describe an example environment in which the invention can be implemented. The details of implementation and operation of clock recovery circuit 300 are then explained in detail.

2. Example Environment

In a broad sense, the invention can be implemented in any graphics system having a digital display unit. Such systems include, without limitation, lap-top and desk-top personal computer systems (PCS), work-stations, special purpose computer systems, central purpose computer systems, and many others. The invention may be implemented in hardware, software, firmware, or combination of the like. One or more embodiments which can use the clock recovery circuit of the present invention is described in the co-pending application entitled, "A Method and Apparatus for Upscaling an Image", which is referred to in the section above entitled "Related Applications."

Figure 7:
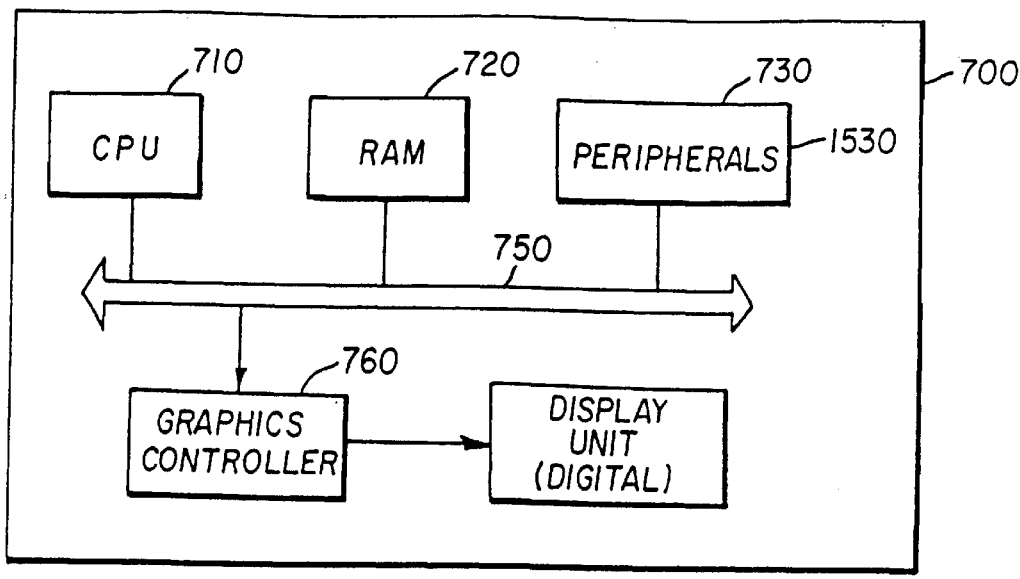
FIG. 7 is a block diagram of an example graphics system implemented in accordance with the present invention.

FIG. 7 is a block diagram of computer system 700 in which the present invention can be implemented. Computer system 700 is only an example of a graphics system in which the present invention can be implemented. Computer system 700 includes central processing unit (CPU) 710, random access memory (RAM) 720, one or more peripherals 730, graphics controller 760, and digital display unit 770. All these components communicate over bus 750, which can in reality include several physical buses connected by appropriate interfaces.

Graphics controller 760 generates analog image data and a corresponding reference signal, and provides both to digital display unit 200. The analog image data can be generated, for example, based on pixel data received from CPU 710 or from an external encoder (not shown). In one embodiment, the analog image data is provided in RGB format and the reference signal includes the VSYNC and HSYNC signals well known in the art and explained above. However, it should be understood that the present invention can be implemented with analog image data and/or reference signals in other formats. For example, analog image data can include video signal data also with a corresponding time reference signal.

Figure 1A:
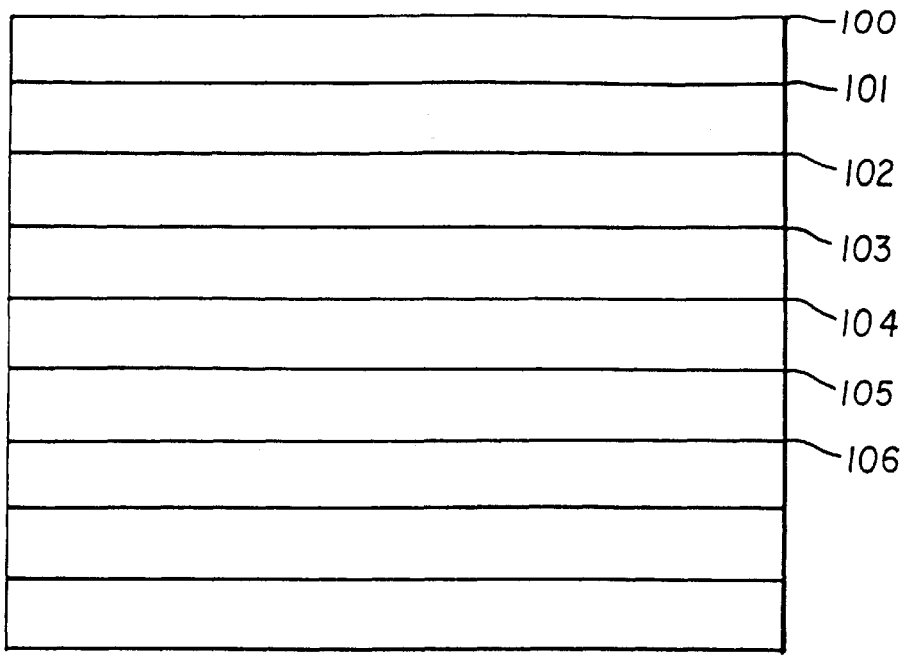
FIG. 1A is a block diagram of an example display screen including several pixels arranged in horizontal rows.
Figure 1B:
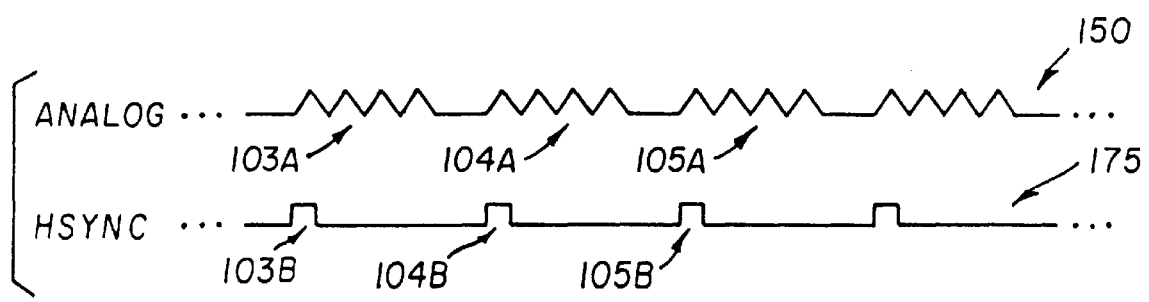
FIG. 1B is a diagram of a signal shown in time domain illustrating an example time reference signal for an analog display data.
Figure 2:
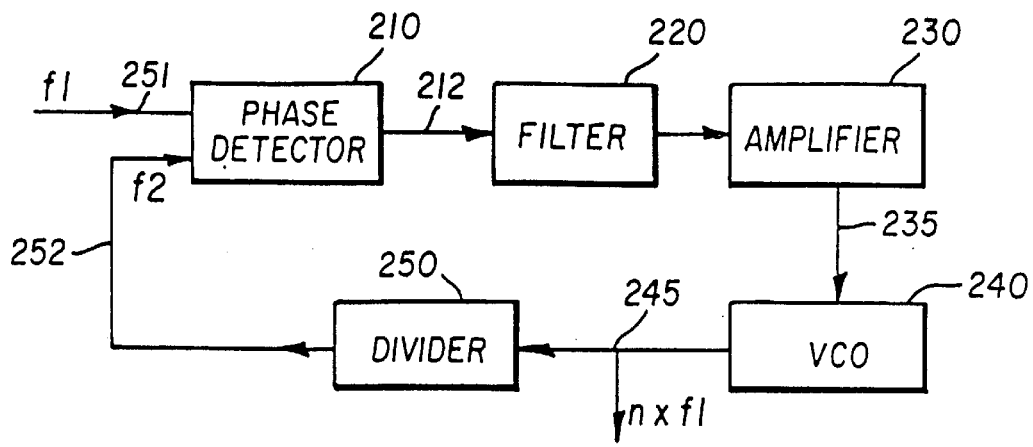
FIG. 2 is a block diagram of a conventional PLL circuit implemented using analog components.

Digital display unit 770 can include a display screen having pixels as explained with reference to FIG. 1A. Digital display unit 770 includes a clock recovery circuit in accordance with the present invention. Using the clock recovery circuit, digital display unit 770 samples the analog signal data. The manner in which analog signal data is sampled if a sampling clock is provided to generate pixel data is well known in the art. Due to the clock recovery circuit of the present invention, digital display unit 770 may display an image corresponding to the analog signal data without a relative skewing of the lines.

CPU 710, RAM 720 and peripherals 730 are conventional in one embodiment of the present invention. CPU 710 can be, for example, a processor such as a Pentium Processor available from Intel Corporation. RAM 720 represents the system/main memory for storing instructions and data. The instructions and data may be read from a peripheral device such a hard-disk. CPU 710 executes the instructions using the data to provide various functions. As a part of executing the instructions, CPU 710 may send commands to graphics controller 710, which generates analog display signal data in a known way. The manner in which an example embodiment of digital display unit 770 displays the image corresponding to the analog display signal will be explained in further detail below.

3. Example Embodiment of Digital Display Unit 770 of the Present Invention

In one embodiment, digital display unit 770 is implemented to operate with a computer system. Digital display unit 770 can be in the form of a flat-panel monitor used in lap-top (note-book computers), a flat-monitor used in desk-top computers and workstations, among other forms. However, it will be apparent to one skilled in the relevant arts how to implement a digital display unit for other graphics system environments such as flat monitor television systems by reading the description provided herein.

Figure 8:
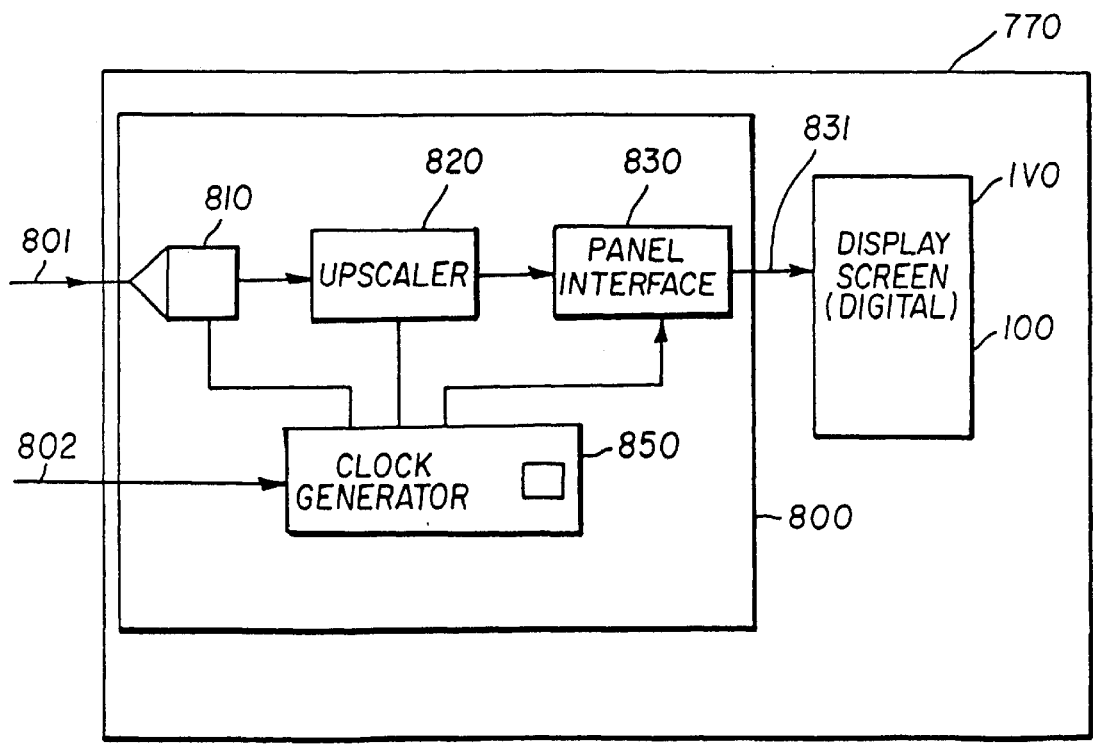
FIG. 8 is a block diagram of an example digital display unit in accordance with the present invention.

FIG. 8 is a block diagram of digital display unit 770 including analog-to-digital converter (ADC) 810, upscaler 820, panel interface 830, clock generator circuit 850, and display screen 100. The output line of ADC 810 is coupled to the input line of upscaler 820. The output line of upscaler 82 is coupled to panel interface 831. The output of panel interface is coupled to display screen 100. Clock generator circuit 850 is coupled to ADC 810, upscaler 820, panel interface 830.

In operation, ADC 810 receives analog signal data on line 801 and a sampling clock signal on line 851. ADC 810 is conventional and samples the analog signal data according to the sampling clock signal. ADC 810 provides the pixel data on line 812 to upscaler 820.

Upscaler 820 uses the pixel data received on line 812 to optionally upscale the image represented by the pixel data. The image may be upscaled, for example, due to the lager size of display screen 100. An embodiment of upscaler 820 is described in co-pending application entitled, "A Method and Apparatus for Upscaling an Image", which is referred to above in the section entitled "Related Applications." In the co-pending application, upscaler 820 may be described as including the clock generation circuit 850 also.

Clock generator 802 generates the clock signals to ADC 810, upscaler 820 and panel interface 830. The individual clock signals may have different frequencies depending on the overall design. One or more the individual clock signals may be synchronized with time reference signal 802 by using the clock recovery circuit of the present invention. The manner in which different frequencies may be computed in one embodiment is also described in the co-pending application entitled, "A method and apparatus for upscaling an image."

In one embodiment, time reference signal 802 may correspond to HSYNC signal. In another embodiment, time reference signal 802 may correspond to VSYNC signal. However, it should be understood that time reference signal 802 may correspond to any other signal (including a combination of HSYNC and VSYNC) as suited in the specific environment.

Display screen 100 is explained in detail above. Display screen 100 may be implemented using any digital screen technologies such as active/passive liquid crystal display (LCD) technologies. Panel interface 830 is designed to generate display signals to display image on display screen 100. Panel interface 830 can be implemented in a known way to generate display signals to display screen 100 from the pixel data received from upscaler 820.

The manner in which the clock recovery circuit synchronizes (or attempts to synchronize) the generated clock with the time reference will now be explained in detail. Specifically, PLL circuit 310 will be explained first. Then, analog filter 320 will be explained. For purpose of illustration, the time reference will be assumed to include a HSYNC signal. However, the present invention can be practiced with other types of reference signals as well.

4. Overview of Digital PLL Circuit of the Present Invention

Figure 4:
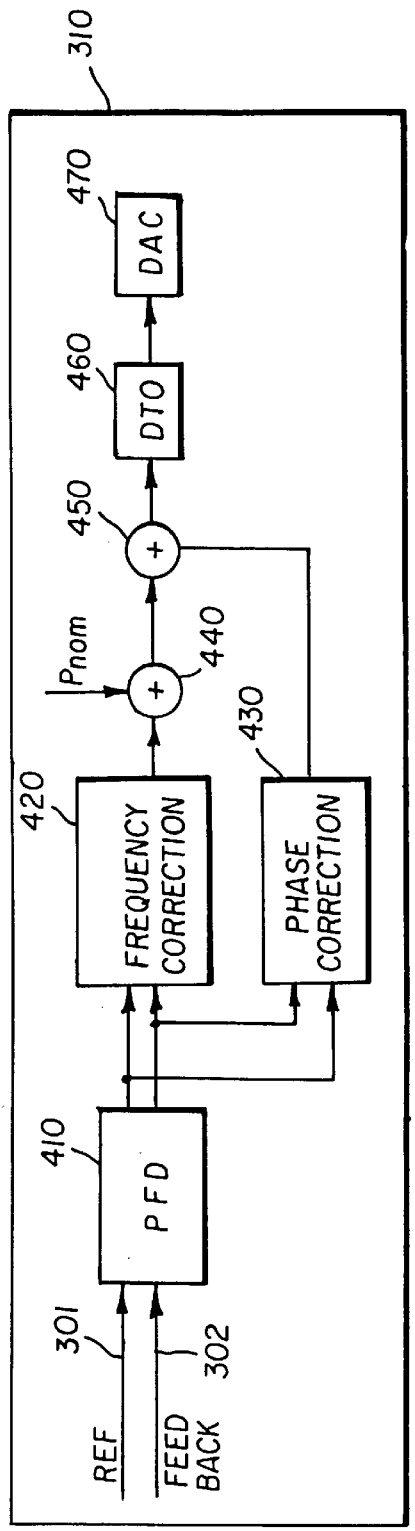
FIG. 4 is a block diagram of a digital PLL circuit illustrating independent loops for tracking frequency and phase.

FIG. 4 is a block diagram illustrating internal blocks of an example embodiment of digital PLL circuit 310. PLL circuit 310 includes phase and frequency detector (PFD) 410, frequency correction logic 420, phase correction logic 430, adders 440 and 450, DTO 460 and DAC 470. Phase correction logic 430 and frequency correction logic 420 are connected to the output of PFD 410. First adder 440 is coupled to the output of frequency correction logic 420. The output of first adder is coupled to second adder 450. Second adder is also coupled to phase correction logic 430. The output of second adder 450 is coupled to DTO 460. The output of DTO is in turn connected to digital to analog converter 470.

In operation, PFD 410 compares the phase and frequency of time reference (HSYNC) signal and feedback signal. PFD 410 is conventional and generates signals on EARLY and LATE lines depending on whether reference signal lags or leads the feedback signal. In one embodiment, a pulse is generated according to the lead or lag and the duration of the pulse is proportional to the amount of lead or lag.

The resynchronization process is achieved by having two separate blocks for correcting long term frequency drifts and phase jitters in the reference signal. By having two separate blocks, the designer may have more control over the resynchronization process.

In general, frequency correction logic 420 is designed to correct the long term frequency drifts in the reference signal. The frequency drifts generally correspond to a change in the reference frequency, typically in the range of few hertz. The drifts can be a result of, for example, temperature fluctuations in the source system generating the source image. Frequency correction logic 420 can be advantageously designed to track the reference signal over a prolonged period.

Adder 440 adds (subtracts) the frequency correction number provided by frequency correction logic 430 to Pnom frequency. Pnom corresponds to an expected frequency of the sampling clock and is used during the frequency acquisition phase. Frequency acquisition phase refers to a time duration during which the PLL loop is stabilizing and locking with the frequency of the reference signal. By providing the Pnom signal, the frequency acquisition period can be decreased.

However, digital PLL 310 can operate without Pnom signal. In this case, the frequency acquisition can take an extended period of time. After the frequency acquisition period is complete, Pnom may not be used. Phase correction logic 430 tracks phase fluctuations in the time reference. The output of phase correction logic 430 represents the degree (or amount) of phase by which the clock signal being generated should be corrected due to the phase difference between time reference signal and feedback signal.

The output of adder 440 represents the current frequency of the loop. The outputs of phase correction logic 420 and adder 440 are added using adder 450. Thus, the output of adder 450 represents the total of Pnom, frequency correction provided by frequency correction logic 420, and phase correction provided by phase correction logic 430. This total represents how far the phase in DTO 460 is advanced per DTO clock cycle. This total can change during each reference clock cycle.

DTO 460 is conventional and is also known as a phase accumulator. DTO 460 generates as an output a ramp signal having a fundamental frequency and other undesirable spectral components. The fundamental frequency represents the frequency of the clock which is synchronized with the time reference signal. The spectral frequencies are undesirable as they may contribute to clock jitter. Accordingly, these spectral frequencies are eliminated using the analog filter 320. DAC 470 converts the digital output of DTO into an analog form suited for processing by analog filter. Analog filter 320 is explained in further detail below. Before describing analog filter 320 in detail, an implementation of digital PLL circuit 310 is explained first.

5. An Implementation of Digital PLL

From the overview provided above, several alternative embodiments of digital PLL can be implemented without departing from the scope and spirit of the present invention. One of such embodiments will now be described with reference to FIG. 6.

Figure 6:
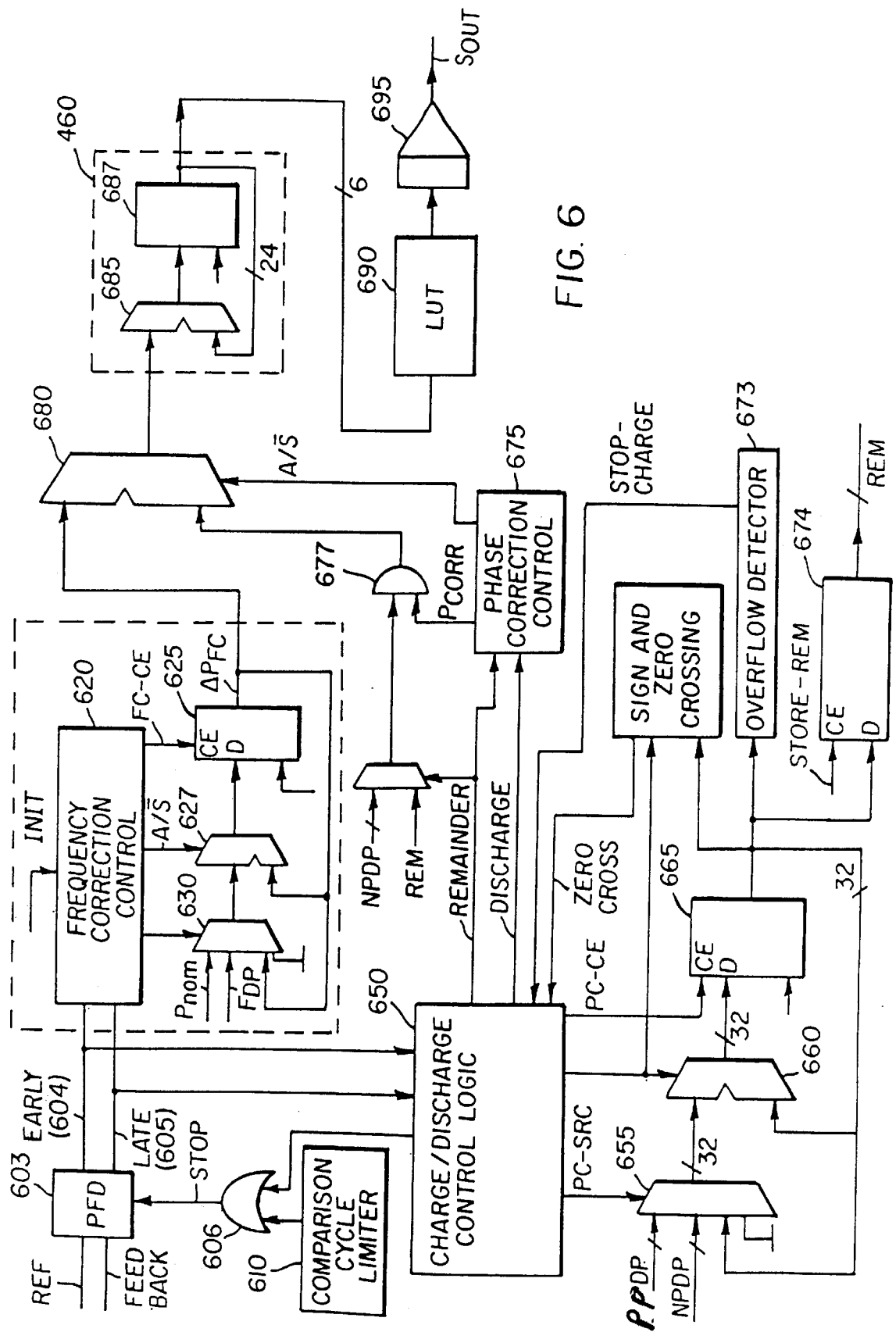
FIG. 6 is a block diagram of an example implementation of a digital PLL in one embodiment of the present invention.

FIG. 6 is a block diagram illustrating the design and operation of an example implementation of digital PLL circuit 310. PLL circuit 310 includes several components and signals interconnecting the components. Each component and signal will be explained in further detail below. Broadly, PLL circuit 310 will be described in three separate sections: (1) phase comparison, (2) frequency correction, and (3) phase correction.

As to phase comparison, PFD 603 has two output signal lines early 604 and late 605 indicating whether the feedback signal (FBACK) is early or late in phase in relation to time reference signal REF. In one embodiment, PFD 603 generates a pulse on early 604, with the pulse having a duration which is proportional to the phase by which FBACK signal is early in comparison to REF signal. The pulse duration is measured in number of reference clock periods, where reference clock refers to a clock of which PLL circuit 310 operates. The pulses on early signal 604 and late signal 605 will be generally referred to as an error pulse. Late signal 605 is similarly explained.

PFD 603 stops comparing REF and FBACK signal when STOP signal is asserted. When the comparison is stopped, both LATE and EARLY signals are unasserted. Charge/discharge control 650 causes STOP signal to be asserted when the phase correction integrator can overflow. Comparison signal limiter 610 causes STOP signal to be asserted when the phase difference exceeds a predetermined number.

As to the frequency correction, frequency correction control 620, multiplexor 630, adder 627 and flip-flops 625 operate to provide the frequency correction. When PLL circuit is initialized (e.g., during the beginning of phase acquisition) as indicated by INIT signal, frequency correction control 620 causes multiplexor 630 to select as output the value on input having number 2. At the same time, A/S (Add/Subtract) signal is asserted to low, causing adder 627 to be set to a zero value by subtracting current accumulator value from itself.

Frequency correction control 620 then causes multiplexor 630 to select the Pnom value. Pnom corresponds to an expected frequency of the sampling block being generated. Accordingly, the frequency acquisition period is reduced to a few cycles assuming that the REF signal has a frequency which is in slight deviation from the expected frequency. Without Pnom, frequency acquisition may take several cycles.

After frequency acquisition, frequency correction control 620 causes Fdp value to be selected by multiplexor 630. The Fdp value is added/subtracted during each reference clock cycle there is the error pulse. Addition of the Fdp value causes the clock frequency to be increased and subtraction causes the clock frequency to be decreased.

Fdp value is provided from a register. The Fdp value represents the loop bandwidth. A higher value of Fdp implies that the PLL 310 will respond faster to changes and lower value implies that the PLL 310 will be more stable. However, as the Fdp value can be changed instantaneously (i.e., within a reference clock cycle) by setting the register, the loop bandwidth can also be changed instantaneously.

Accordingly, a designer of the digital PLL 310 is given considerable flexibility to change the loop bandwidth depending on the specific situation. For example, during phase acquisition loop, Fdp value can be set fairly high, and it can be set to a low value once the loop stabilizes. In addition, Fdp can be based on adaptive schemes which base individual Fdp values on the historical values of phase corrections. The manner in which Fdp value is set in one embodiment will be explained below. Frequency correction control 620 enables FC-CE signal only during the length of the error pulse. The output of flip-flop 625 represents the current average frequency of the clock being generated.

As to the phase correction, phase correction is broadly explained first. Charge/discharge control 650 along with the associated circuitry may be viewed as a leaky integrator, but implemented in digital domain. The integrator is charged to a level using the PPDP value. The level to which it is charged depends on the duration of the error pulse length. After it is charged, the integrator is slowly discharged using the NPDP value. The NPDP value is smaller in value in comparison to PPDP value and thus the discharge occurs during an extended period of time. The phase correction is performed during the discharge cycles. The manner in which charging and discharging are performed is explained in further detail below. The manner in which NPDP and PPDP values are computed in one embodiment will then be explained.

Charge/discharge control 650, multiplexor 655, adder 660, and flip-flop 665 together determine the charge on the integrator. It should be noted that flip-flop 665 (and other flip-flops described here) in reality includes several flip-flops, with each flip-flop storing one bit. The value in adder 660 is cleared at the beginning of each time reference cycle (e.g., when a HSYNC pulse is received). The PPDP value is added to adder 660 during each reference cycle (i.e., the internal clock of PLL) the error pulse is present. If the result of the addition exceeds a predetermined threshold, the integrator is determined to have overflown, and the integrator overflow detector 673 causes the STOP signal coupled to PFD 603 be asserted. When the end of the error pulse is encountered, flip-flop 665 stores a value indicative of the charge on the integrator.

After the charging is complete, the discharge phase is begun. Phase correction of the clock is performed during the discharge phase. During the discharge phase, charge/discharge control 650 causes NPDP value subtracted iteratively from accumulator 660 during each reference clock cycle. During each discharge clock cycle, inactive REMINDER signal causes NPDP value to be selected by multiplexor 652. Also, phase correction control 675 provides PCORR signal so as to gate the output of AND logic 677 to adder 680. Otherwise, PCORR signal is set at low signal level (logical value of 0) to set the output of AND logic 677 to zero. Phase correction control 675 asserts the A/S input of adder 680 to cause the output of adder 677 to be added or subtracted. The value is added if the REF signal is ahead of FBACK signal and subtracted otherwise.

As NPDP value is subtracted during each reference clock cycle, it is possible that the result after the subtraction may be a negative number. In this case, the clock signal has been over corrected. Accordingly, sign and zero crossing detector 670 detects that the phase has been over corrected and causes charge/discharge control 650 to take corrective action. The negative number is stored in flip-flop 674.

Charge/discharge control 650 asserts REMINDER signal to 1 to cause multiplexor 652 to select the value stored in flip-flop 674. The selected value to provided to adder 680, which corrects the overcorrection. Phase correction control 675 switches the value on the A/S input to adder 680. That is, if previously the a 0 value is provided, a value of 1 is provided when forwarding the overcorrection parameter.

The operation of DTO has been explained above with reference to FIG. 4 and will not be repeated here in the interest of conciseness. Briefly stated, DTO 460 generates as an output a ramp signal representing phase of a fundamental frequency and other spectral components such as images resulting from the digital sampling. The fundamental frequency represents the frequency of the clock which is synchronized with the time reference signal. The spectral components are undesirable as they may contribute to clock jitter. The remaining portion of the circuit is designed to eliminate these other frequencies while preserving the fundamental frequency.

LUT 690 is conventional and translates the phase output of DTO 460 to an amplitude value. The phase value may be converted to either a sine wave or a triangle as is also known well in the art. DAC 695 converts the output of LUT 690 to an analog signal for suitable processing by analog filter 320. An embodiment of analog filter 320 is explained later.

It is again noted, that the above description of FIG. 6 is merely an example implementation and it will be apparent to one skilled in the art to implement various modifications without departing from the scope and the spirit of the present invention. In the above description, Pnom, NPDP and PPDP values have been described to be used. One example way of computing these parameters is explained.

6. Computation of the loop parameters

Pnom can be calculated based on the number of reference clocks in the hor line (Hor_Rcount):

$$\text{Hor\_Rcount} = Th/Trclk \tag{1}$$

where Trclk represents the clock period of reference clock and Th represents the horizontal period (time between two successive Hsync pulses).

$$Pnom = srs\_htotal * Qdto/Hor\_Rcount \tag{2}$$

Here, Qdto is DTO module, (i.e., $2^{**}n$, where n is the number of bits in DTO). It should be noted that Pnom isn't dependent on locking scheme. That is, the clock signal can be locked on HSYNC, VSYNC, or the like.

Positive slope (Charging) parameter for phase correction loop is derived from Pnom. It is also independent of the locking scheme. Kpdp controls damping of phase correction loop. For optimal tracking it may be set to 3 or 3.

$$Ppdp = Pnom/Kpdp \tag{3}$$

Negative slope parameter (discharging) is derived from Ppdp. NPDP is usually close to Ppdp if loop is unlocked and several times smaller (8 . . . 16) if loop is locked (to minimize phase jumps).

$$Npdp = Ppdp/Knpdp \tag{4}$$

$$Knpdp = 2 \ldots 16$$

Frequency correction parameter is dependent on locking scheme. It means amount of frequency adjustment per one Rclk phase tracking error.

If the FBACK signal is locked on HSYNC pulses as a time reference $$Fdp = Pnom/(Kfdp * Vdiv * Hor\_Rcount) \tag{5a}$$

If FBACK signal is locked in Vsync pulses as a time reference $$Fdp = Pnom/(Kfdp * Vtotal * Hor\_Rcount) \tag{5b}$$

Here Vdiv is vertical Hsync divider (1 . . . n). If Vdiv is 1, every Hsync is used for comparison. If Vdiv is 2, every other Hsync is used, etc. Vtotal is number of lines in the source frame if VSYNC locking is used.

7. Analog Filter 320

Figure 5:
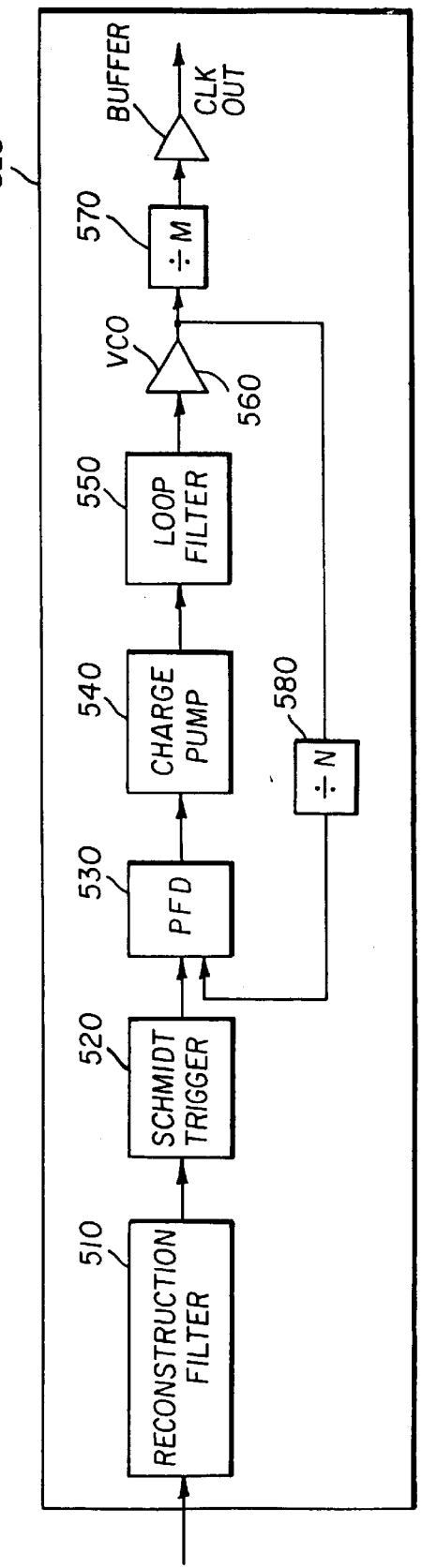
FIG. 5 is a block diagram of an example analog filter to filter undesirable frequency components from the output of the digital PLL.

As noted above, analog filter 320 is designed to preserve the fundamental frequency generated by DTO while eliminating the other frequencies. Analog filter 320 can be implemented using active or passive filters or using a phase-locked loop as is well-known in the art. An example embodiment of analog filter 320 is illustrated with reference to FIG. 5.

Analog filter 320 is conventional and includes a DAC reconstruction filter 510. Schmidt trigger 520 slices the sine-wave in a known way to convert the sine-wave into digital signal (two level quantization). The PLL loop comprising PFD 530, charge pump 540, loop filter 550, VCO 560, and divider 580 is designed to eliminate all the undesirable frequencies, while preserving the fundamental frequency. The value of N in divider 580 is kept relatively small (at or below 8). VCO 560 may be designed to generate sampling clock signal, which can be used to sample the analog signal data. Dividers 570 and 580 may be used to shift the Vco frequency into the operating range of Vco 560.

Thus, the output of analog filter 320 includes filtered signal with well-suppressed spurious spectral components.

16. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A circuit for use in a digital display unit of a computer system, and circuit for generating a plurality of pixel data elements from an analog image data received by said digital display unit, said digital display unit further receiving a time reference signal associated with said analog image data, said time reference signal having a high frequency, said circuit comprising:

an analog-to-digital converter (ADC) for receiving said analog image data, said ADC sampling said analog image data using a sampling clock to generate a plurality of pixel data elements corresponding to said plurality of pixels, wherein said sampling clock has a sampling frequency equal to said high frequency;

a clock generator circuit comprising a phase-locked loop (PLL) circuit for generating said sampling clock, wherein said sampling clock is synchronized with said time reference signal with a jitter of less than a few nano-seconds, said PLL comprising:

a discrete time oscillator (DTO) for receiving a digital input and generating a signal representative of said sampling clock with a frequency determined by said digital input; and a digital circuit for receiving said time reference signal and a feedback signal, wherein said feedback signal is generated by dividing said sampling clock, said digital circuit generating said digital input according to the difference of the phases of said time reference signal and said feedback signal, said digital input causing said DTO to generate said signal synchronized with said time reference signal, said digital circuit comprising:

a frequency correction logic for adjusting the phase of said sampling clock according to the long-term drifts in the frequency of said time reference signal; and a phase correction logic for adjusting the phase of said sampling clock according to the phase difference in said feedback signal and said time reference signal, wherein said frequency correction logic and said phase correction logic are implemented as two separate control loops, wherein a panel interface included in said digital display unit can generate display signals for a display screen based on said plurality of pixel data elements.

2. The circuit of claim 1, wherein said clock generator circuit further comprises an analog filter to eliminate any undesirable frequencies from said signal representative of said sampling clock to generate said sampling clock.

3. The circuit of claim 1, further comprising a phase and frequency detector for determining the difference of phase between said feedback signal and said time reference signal.

4. The circuit of claim 3, further comprising a charge/discharge control logic for determining the amount of phase correction to be made based on the determination of said difference of phase.

5. The circuit of claim 1, wherein said analog image data and said time reference signal are received on two separate signal paths.

6. The circuit of claim 5, wherein said reference clock comprises a binary signal.

7. The circuit of claim 1, wherein said digital circuit distributes phase error between said feedback signal and said reference signal during a comparison cycle by changing the phase of individual clock pulses in said sampling clock.

8. The circuit of claim 1, wherein said frequency correction logic generates a multi-bit number, wherein said multi-bit number is representative of the amount of phase advance of said sampling clock generated by said DTO during a DTO clock period, and wherein said multi-bit representation enables said PLL to reach said sampling frequency within a short duration.

9. The circuit of claim 1, wherein said frequency correction logic comprises:
- a first multiplexor accepting as input Pnom and Fdp values, wherein Pnom represents an expected frequency of said sampling clock and Fdp represents the correction due to the long-term frequency drifts;
- a flip-flop for storing a value representative of the phase correction corresponding to the frequency correction logic;
- an adder for adding or subtracting the output of said first multiplexor from the value stored in said flip-flop, wherein the output of said adder is stored in said flip-flop; and
- a frequency correction control coupled to said flip-flop and said adder, wherein said frequency correction control causes said flip-flop to be set to Pnom at the beginning of a phase acquisition phase, and wherein said frequency correction control causes said adder to add or subtract Fdp depending on whether the sampling clock is early or late in comparison to said time reference.

10. The circuit of claim 1, further comprising:
- a phase and frequency detector for determining the difference of phase between said feedback signal and said time reference signal, wherein said phase and frequency detector asserts an EARLY signal a number of clock pulses proportionate to the difference of phase by which said feedback signal is earlier than said time reference signal and a or a LATE signal a number of pulses proportionate to the difference of phase by which said feedback signal is later than said time reference signal; and
- a charge/discharge control logic implemented using digital components, said charge/discharge control logic including a phase integrator, said charge/discharge control logic charging said phase integrator according to the number of pulses said EARLY signal or said LATE signal is asserted, said charge/discharge logic discharging over a longer period of time than the charging period so as to spread the difference in phase over a comparison cycle, wherein the phase of said sampling clock is corrected during the discharging period.

11. The circuit of claim 10, further comprising a sign and zero crossing detector for correcting any over-correction performed by said charge/discharge logic during said discharging period.

* * * * *